(12) United States Patent
Davis

(10) Patent No.: US 8,582,295 B2
(45) Date of Patent: Nov. 12, 2013

(54) ELECTRONIC SYSTEM

(75) Inventor: Simon Peter Davis, Fareham (GB)

(73) Assignee: Aqua Cooling Solutions Ltd. (GB)

( * ) Notice: Subject to any disclaimer, the term of this patent is extended or adjusted under 35 U.S.C. 154(b) by 241 days.

(21) Appl. No.: 13/122,939

(22) PCT Filed: Jul. 31, 2009

(86) PCT No.: PCT/GB2009/050956
§ 371 (c)(1),
(2), (4) Date: Jun. 10, 2011

(87) PCT Pub. No.: WO2010/049710
PCT Pub. Date: May 6, 2010

(65) Prior Publication Data
US 2011/0226446 A1    Sep. 22, 2011

(30) Foreign Application Priority Data

Oct. 30, 2008  (GB) .................................. 0819910.1

(51) Int. Cl.
*F28D 15/00* (2006.01)
*H05K 7/20* (2006.01)

(52) U.S. Cl.
USPC ...... 361/688; 361/679.53; 361/698; 361/699; 165/80.4; 165/104.22; 165/104.33

(58) Field of Classification Search
USPC ............... 361/679.46, 679.53, 688, 689, 698, 361/699, 702–712, 715–727; 165/80.2, 165/80.3, 80.4, 104.22, 104.26, 104.33, 165/185; 62/259.2; 378/130, 200; 257/714
See application file for complete search history.

(56) References Cited

U.S. PATENT DOCUMENTS

| 4,471,907 | A | * | 9/1984 | Gerstmann ..................... 237/65 |
| 4,698,728 | A | | 10/1987 | Tustaniwskyj et al. |
| 4,967,832 | A | | 11/1990 | Porter |
| 5,226,471 | A | * | 7/1993 | Stefani .......................... 165/200 |
| 5,348,076 | A | * | 9/1994 | Asakawa ....................... 165/282 |
| 5,535,818 | A | * | 7/1996 | Fujisaki et al. .......... 165/104.33 |

(Continued)

FOREIGN PATENT DOCUMENTS

| CA | 1185654 | 4/1985 |
| EP | 0243239 | 10/1987 |

(Continued)

OTHER PUBLICATIONS

International Search Report mailed Nov. 30, 2009, directed towards International application No. PCT/GB2009/050956; 3 pages.

(Continued)

*Primary Examiner* — Michail V Datskovskiy
(74) *Attorney, Agent, or Firm* — Baker & Hostetler LLP

(57) ABSTRACT

An electronic system includes an electronic device and a heat exchanger for exchanging heat with the device. The heat exchanger includes a flow duct for receiving a fluid, at least a portion of the flow duct being arranged in thermal communication with the device. The system further includes a pump associated with the flow duct and a Venturi tube for reducing the pressure of the fluid in the portion of the flow duct to a value less than the pressure external to the duct, to minimize any leakage of the fluid onto the device in the event the portion of the flow duct develops a leak.

14 Claims, 4 Drawing Sheets

(56) References Cited

U.S. PATENT DOCUMENTS

| | | | |
|---|---|---|---|
| 5,587,880 A | 12/1996 | Phillips et al. | |
| 5,950,714 A | 9/1999 | Schneider et al. | |
| 6,154,363 A | 11/2000 | Chang | |
| 6,371,157 B1* | 4/2002 | See et al. | 137/565.22 |
| 6,623,160 B2* | 9/2003 | McCarthy, Jr. | 378/200 |
| 7,011,143 B2* | 3/2006 | Corrado et al. | 165/80.4 |
| 7,055,341 B2* | 6/2006 | Nori et al. | 62/259.2 |
| 8,307,885 B2* | 11/2012 | Kim et al. | 165/104.26 |
| 2003/0016498 A1 | 1/2003 | Kurokawa et al. | |
| 2005/0065584 A1* | 3/2005 | Schiff et al. | 607/105 |
| 2006/0280292 A1 | 12/2006 | McCarthy, Jr. | |
| 2007/0064394 A1* | 3/2007 | Chen et al. | 361/699 |
| 2007/0209782 A1 | 9/2007 | Wyatt et al. | |
| 2007/0263356 A1 | 11/2007 | Weber et al. | |
| 2009/0014156 A1* | 1/2009 | Vetrovec | 165/104.31 |

FOREIGN PATENT DOCUMENTS

| | | |
|---|---|---|
| EP | 0 411 119 | 2/1991 |
| WO | WO-95/16900 | 6/1995 |
| WO | WO-00/65890 | 11/2000 |
| WO | WO-01/55662 | 8/2001 |
| WO | WO-2008/006362 | 1/2008 |

OTHER PUBLICATIONS

GB International Search Report mailed Dec. 9, 2008, directed towards GB application No. 0819910.1; 2 pages.

* cited by examiner

ELECTRONIC SYSTEM

REFERENCE TO RELATED APPLICATIONS

This application is a national stage application under 35 USC 371 of International Application No. PCT/GB2009/050956, filed Jul. 31, 2009, which claims the priority of United Kingdom Application No. 0819910.1, filed Oct. 30, 2008, the contents of which prior applications are incorporated herein by reference.

FIELD OF THE INVENTION

The present invention relates to an electronic system and particularly, but not exclusively to a computer system.

BACKGROUND OF THE INVENTION

Computer systems, particularly so-called computer server units, generate significant heat during use and this heat must be removed to minimise damage to the associated components and provide for optimum component operation. The removal of heat is conventionally achieved by moving air over the components. The air is cooled at a remote location using heat exchangers to enable a temperature difference to be maintained between the components and the air flowing thereover to be maintained. However, as the heat generated by such components increases in line with their ever increasing sophistication, together with the number of components and devices installed in any one location, the volume of air flow which must be passed through a server unit is correspondingly increased. Ultimately, the air flow becomes such that it may cause damage to or otherwise disrupt the components and must, therefore, be replaced by a more efficient cooling mechanism.

The removal of heat may be achieved by passing a liquid through a network of tubes in close proximity to the various components to extract the heat. However, if the tube becomes punctured or a joint between the tubes develops a leak, then the fluid will pass onto the associated components, which may thus further damage the server or computer.

The aforementioned disadvantages have been partially addressed in a known cooling system as illustrated in FIG. 1. Apparatus 10 is provided for cooling equipment 12 mounted on a framework 14. A first reservoir 16 of coolant 18 is provided in the proximity of the framework 14, a conduit 20 extends from reservoir 16 and describes a convoluted path over framework 14 to thereby enhance the surface area of conduit 20 that is in thermal communication with equipment 12. The conduit 20 terminates at a second reservoir 22, also configured to accommodate coolant 18. An outlet of reservoir 22 feeds to a pump 24 via a conduit 26 to draw fluid from reservoir 22 which, in turn draws coolant through conduit 20. Pump 24 also serves to return coolant to reservoir 16 via conduit 28.

Pump 24 reduces the pressure of the coolant travelling through conduit 20 below atmospheric pressure. Consequently, if the conduit 20 is punctured or otherwise breached such that a potential leak path is formed therein, air is drawn into conduit 20 from the surrounding environment. A level of coolant in the second reservoir 22 drops as the air is drawn into the system 10. Once this level passes below a lower level detection sensor 30 the pump 24 is switched off and gravity is used to feed coolant 18 into reservoir 22 until an upper level detection or sensor 32 senses an increase in coolant level within the second reservoir 22. It follows that during this period of no pumping activity the pressure in the conduit 20 increases and there is a risk of coolant egress from the conduit 20 or that the framework 14 must be immediately isolated from the cooling system whilst the leak is repaired.

It is desirable to provide a cooling system that is able to continue operation of apparatus even if a leak of the aforementioned type is detected. We have now devised an electronic system which alleviates at least some of the above-mentioned problems.

SUMMARY OF THE INVENTION

According to a first aspect of the present invention, there is provided an electronic system, the system comprising:
an electronic system, the system comprising:
an electronic device;
a heat exchanger for exchanging heat with the device, the heat exchanger comprising a flow duct for receiving a fluid, at least a portion of the flow duct being arranged for thermal communication with the device; and
means for reducing the pressure of the fluid in the portion of the flow duct to a value less than the pressure external to the duct, the pressure reducing means comprises:
a pump associated with the flow duct;
and a Venturi tube.

The reduced pressure of the fluid within the heat exchanger with respect to the pressure outside of the heat exchanger ensures that in the event of a leak or puncture in one of the flow ducts, for example tubes, of the heat exchanger, the fluid will not pass onto the components of the associated device. The reduced pressure thus ensures that the fluid is maintained within the tubes. Furthermore, by providing a Venturi tube in the pressure reducing means, the capacity of the system can readily be scaled up to control the thermal environment of an entire room of computational equipment without the need to provide additional local pumps.

The pump may be arranged within the flow duct. The fluid may comprise a liquid.

The internal cross-sectional area of the portion of the flow duct may be less than the internal cross-sectional area of a length of the flow duct, excluding said portion.

The portion of the flow duct may be arranged in thermal contact with those parts of the electronic device requiring the exchange of heat.

The electronic system may further comprise leak detection means for detecting a breach in the flow duct. The detection means may comprise sensing means for sensing the pressure of the fluid within the at least one flow duct. Alternatively, or in addition, the leak detection means may comprise ultrasonic sensing means for sensing the presence of air within the flow duct.

The system may further comprise alarm means for providing an alarm in response to signals output from the sensing means. The alarm means may be arranged to generate an alarm when the pressure sensing means senses a pressure value that is outside a range of pressure values.

The electronic device may comprise a computer or a computer server or a suite of computer servers e.g. a data room, each server may be mounted on a separate framework. Each framework may have a flow duct associated therewith, each respective flow duct being arranged in fluid communication with the pressure reducing means.

Preferably, the heat exchanger removes heat from the at least one device.

According to a second aspect of the present invention, there is provided a computer heat exchanger, the heat exchanger comprising:

a flow duct for receiving a fluid, at least a portion of the flow duct being arranged in thermal communication with the device: and means for reducing the pressure of the fluid in the portion of the flow duct to a value less than the pressure external to the duct, the pressure reducing means comprising:

a pump associated with the flow duct;

and a Venturi tube.

BRIEF DESCRIPTION OF THE DRAWINGS

Embodiments of the present invention will now be described by way of example only and with reference to the accompanying drawings, in which.

DETAILED DESCRIPTION OF THE INVENTION

Figure 1:
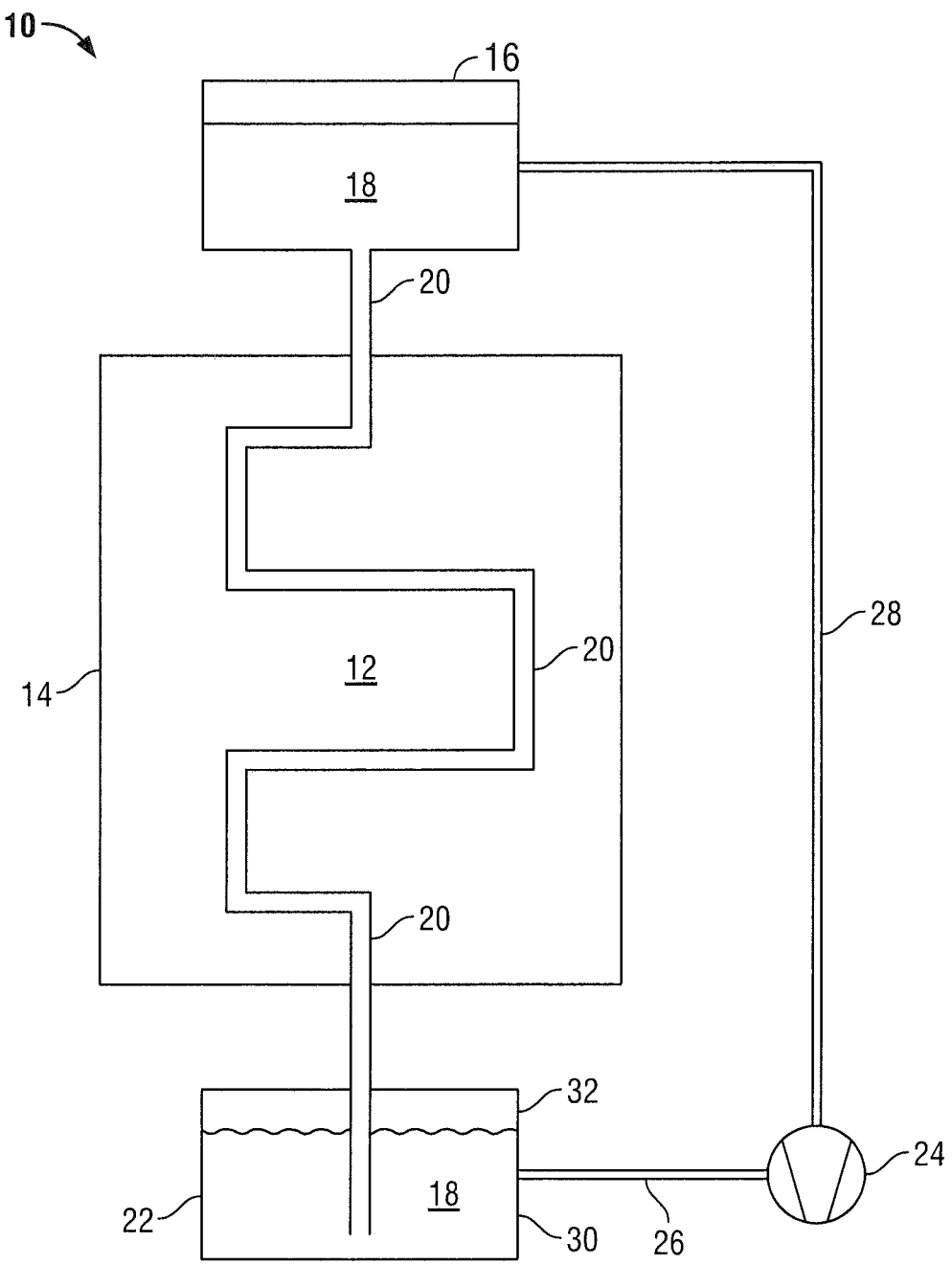
FIG. 1 is a schematic illustration of a conventional cooling system.
Figure 2:
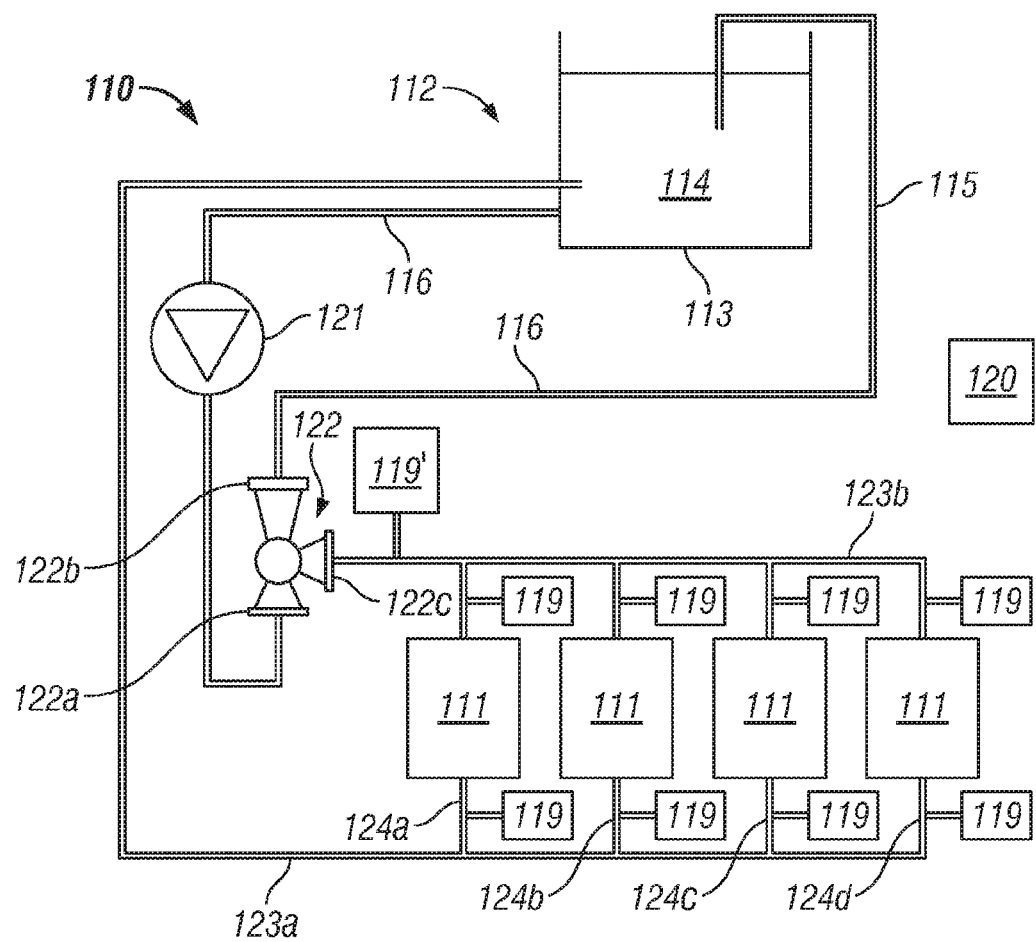
FIG. 2 is a schematic illustration of an electronic system according to a first embodiment of the present invention; and, FIG. 3 is a schematic illustration of an electronic system according to a second embodiment of the present invention.

Referring to FIG. 2 of the drawings, there is shown an electronic system 110 according to a first embodiment of the present invention. The system 110 comprises a plurality of computer components 111 and a heat exchanger 112 for removing the heat generated by the components ill during use of the computer (not shown).

The heat exchanger 112 comprises a fluid reservoir 113 for holding the fluid, for example a liquid 114, and a circuit 15 through which the liquid 114 can flow. The circuit 115 comprises a primary flow duct 116 which extends from the base of the reservoir 113, for example, along a first flow path before returning to the reservoir 113 at a position arranged near the surface of the liquid 114 within the reservoir 113, for example. The primary flow duct 116 further comprises a Venturi tube 122, arranged downstream of the pump 121 within the primary flow duct 116, which comprises an inlet 122a and an outlet 122b connected by a narrow waist region 122c. As the liquid 114 passes from the inlet 122a to the outlet 122b in moving along the primary flow duct 116, it is necessary for the liquid 114 to move more quickly through the narrow waist region 122c than the inlet 122a and outlet 122b, due to the conservation of mass. Accordingly, the pressure of the liquid 114 within this waist region 122c will become reduced with respect to the pressure of the liquid 114 within the primary flow duct 116.

The circuit 115 further comprises a first secondary flow duct 123a which extends from the reservoir 113 at a position near the base of the reservoir 113, for example. The first secondary flow duct 123a separates into a plurality of tertiary flow ducts 124a-d, which pass in close proximity with the computer components 111 to facilitate the removal of the heat generated from the components during the operation of the computer (not shown). The tertiary flow ducts 124a-d, subsequently combine with a second secondary flow duct 123b, that is arranged in fluid communication with the waist region 122c of the Venturi tube 122.

In use, the liquid 114 is pumped through the primary flow duct 116 along the first flow path by a pump 121 arranged within the primary flow duct 116. The reduced pressure of the liquid 114 within the waist region 122c of the Venturi tube 122 and thus the second secondary flow duct 123b, with respect to the liquid 114 within the reservoir, causes the liquid 114 to become drawn along a second flow path which is along the first secondary flow duct 123a and into the tertiary flow ducts 124a-d. The tertiary flow ducts 124a-d may comprise a reduced diameter with respect to the secondary flow ducts 123 to maximise the surface area of the liquid for the efficient removal of heat from the components 111. The pressure in the tertiary flow ducts 124a-d is, consequently sub atmospheric e.g. in the range of 0.6 to 0.8 bar abs, preferably in the range of 0.7 to 0.75 bar abs.

The liquid 114 subsequently passes into the second secondary flow duct 123b and into the waist 122c of the Venturi tube 122 before returning to the reservoir 113 via the outlet 122b of the Venturi tube 122, along the primary flow duct 116. The liquid 114 passing within the tertiary flow ducts 124a-d will become heated as the heat is extracted from the components 111. This heated liquid will subsequently pass into the reservoir 113 where the heat can dissipate into the large volume of liquid 114 held therein.

In the event that one or more of the tertiary flow ducts 124a-d become punctured or if one or more of the seals (not shown) at the joints between the secondary 123a-b and tertiary flow ducts 124a-d become defective for example, the fluid surrounding the tertiary ducts 124a-d, for example air, will become drawn into the respective duct through the puncture (not shown) or defective seal (not shown), rather than the liquid 114 escaping from the respective duct onto the computer components 111. This will cause the pressure of the liquid 114 flowing along the second flow path to increase. This increase in pressure will be sensed by a pressure sensor 119 arranged within the tertiary flow duct 124a-d. Each sensor 119 is arranged in communication with an alarm 120 such that when the sensor 119 detects a rise in pressure above a threshold value, the sensor 119 will output a signal to the alarm 120 to generate an alarm signal to warn an operator (not shown) for example, of the leak within the system 110. Fewer sensors 119 than the number illustrated in FIG. 2 may be provided e.g. a single sensor 119 may be provided in each tertiary flow duct 124a-d or a single sensor 119 may be located in an inflow secondary flow duct 123a and a second sensor 119 may be located in a return secondary flow duct 123b.

Alternatively, or additionally a sensor 119' may be provided in association with the secondary 123a-b and/or tertiary flow ducts 124a-d. Sensor 119' is an ultrasonic air detector, able to detect the presence of even small quantities of air that may be introduced into the flow ducts through a pinhole sized breach/puncture. Pressure sensor 119 may not be sufficiently sensitive to detect small leaks of this nature.

Operation of the electronic system 110 can proceed as normal until such a time that a planned maintenance event is scheduled when the breach can be repaired. In the meantime, little loss of cooling efficiently is experienced, and any such loss is local to the breach/puncture in the duct. Consequently, little or no disruption to the normal operation of the system 110 is experienced.

Figure 3:
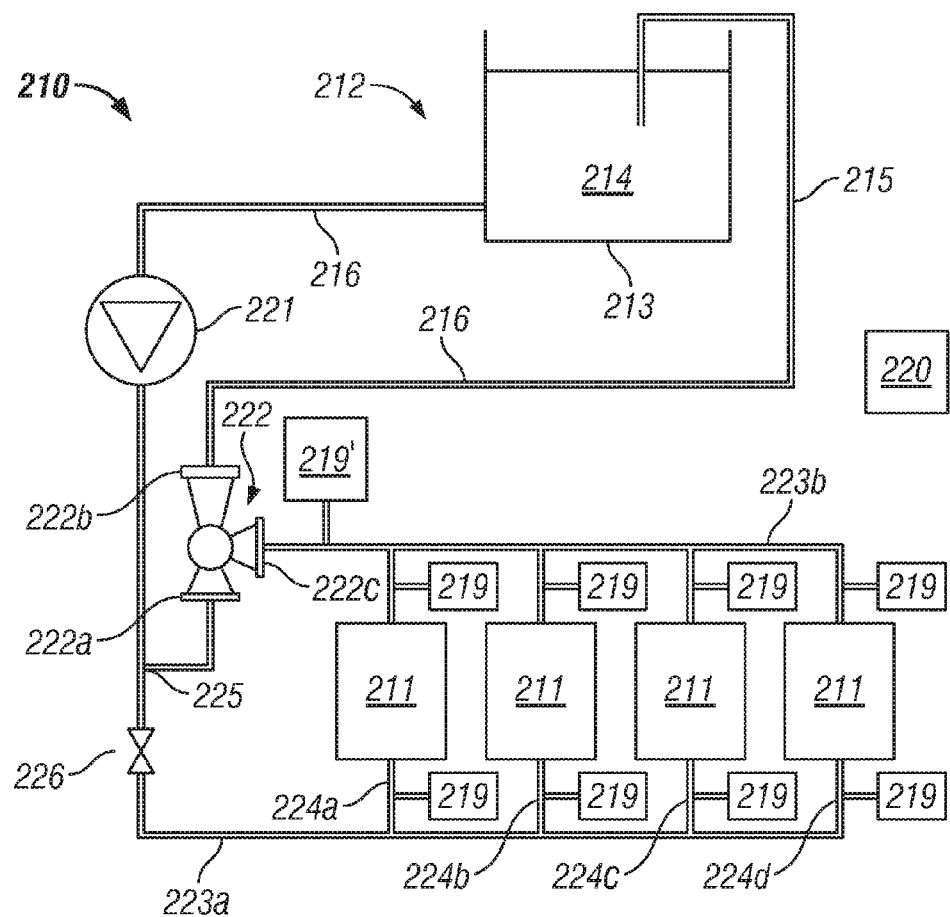
Figure 4:
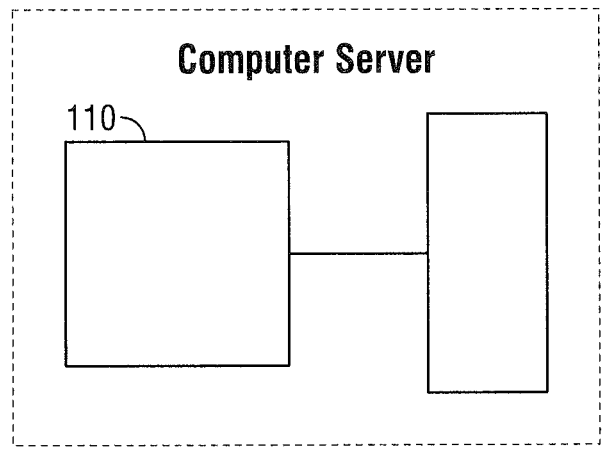
FIG. 4 is a schematic illustration of an electronic system according to a third embodiment of the present invention.
Figure 5:
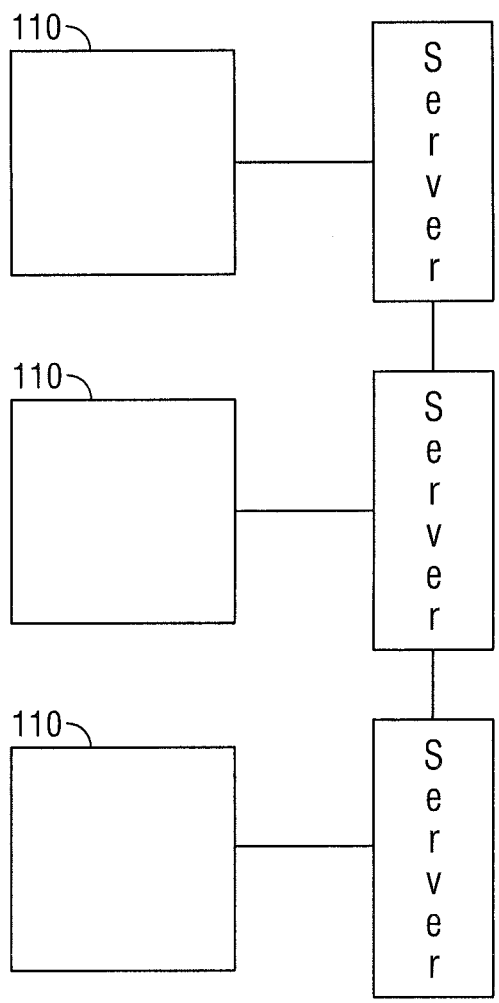
FIG. 5 is a schematic illustration of an electronic system according to a third embodiment of the present invention employing a suite of computer servers.

According to a second embodiment of the invention, as seen in FIG. 3 of the drawings, there is shown an alternative electronic system 210 according to the present invention. The system 210 comprises a plurality of computer components 211 and a heat exchanger 212 for removing the heat generated by the components 211 during use of the computer (not shown).

The heat exchanger 212 comprises a fluid reservoir 213 for holding the fluid, for example a liquid 214, and a circuit 215 through which the liquid 214 can flow. The circuit 215 comprises a first flow path along a primary flow duct 216 which extends from the base of the reservoir 213, for example, before returning to the reservoir 213 at a position arranged near the surface of the liquid 213, for example. The liquid 214 is pumped through the primary flow duct 216 along the first path by a pump 221 arranged within the primary flow duct 216. The primary flow duct 216 further comprises a Venturi tube 222 positioned therein, downstream of the pump 221 and comprises an inlet 222a and an outlet 222b connected by a narrow waist region 222c. As the liquid 214 passes from the inlet 222a to the outlet 222b in moving along the primary flow duct 216, it is necessary for the liquid 214 to move more quickly through the narrow waist region 222c due to the conservation of mass and so the pressure of the liquid 214 within this waist region 222c will become reduced. At a position which lies within the primary flow duct 216, intermediate the position of the pump 221 and Venturi tube 222, there is provided a junction 225 to a first secondary flow duct 223a, through which liquid 214 can flow along a second flow path. The first secondary flow duct 223a comprises a valve 226 which serves to enable the pressure of the liquid 214 exiting the valve 226 to be reduced compared with the pressure of the liquid 214 that is supplied to the valve 226. Arranged downstream of the valve 226, the first secondary flow duct 223a branches into a plurality of tertiary flow ducts 224a-d that pass in close proximity with the components 211 of a computer (not shown). The tertiary flow ducts 224a-d subsequently combine with a second secondary flow duct 223b that is in fluid communication with the waist 222c of the Venturi tube 222.

The liquid 214 within the waist 222c of the Venturi tube 222 is at a reduced pressure compared with the pressure of the liquid 214 within the primary flow duct 216 and the section of the first secondary flow duct 223a arranged downstream of the valve 226. As a result, this causes the liquid 214 to flow from the valve 226 through the tertiary flow ducts 224a-d into the waist 222c of the Venturi tube 222 via the second secondary flow duct 223b. The liquid 214 subsequently exits the Venturi tube 222 via the outlet 222b and is returned to the reservoir 213 along the primary flow duct 216. The liquid 214 passing within the tertiary flow ducts 224a-d will become heated as the heat is extracted from the components 211. This heated liquid will subsequently pass into the reservoir 213 where the heat can dissipate into the large volume of liquid 214 held therein.

The liquid 214 flowing into the tertiary flow ducts 224a-d is at a reduced pressure compared with the pressure of the liquid 214 within the primary flow duct 216. Accordingly, the pressure of the liquid within the tertiary flow ducts 224a-d becomes reduced to a level that is below the pressure of the fluid, for example air, that surrounds the tertiary flow ducts 224a-d, e.g. approximately 0.7° bar abs. In the event that one or more of the tertiary flow ducts 224a-d becomes punctured or if one or more of the seals (not shown) at the joints between the secondary 223a-b and tertiary flow ducts 224a-d become defective for example, then the fluid surrounding the tertiary ducts 224a-d will become drawn into the ducts, rather than escaping onto the computer components 211. This will cause the pressure within the ducts to increase, which will be sensed by a pressure sensor 219 arranged within the tertiary flow ducts 224a-d. Each sensor 219 is arranged in communication with an alarm 220 such that when the sensor 219 detects a rise in pressure above a threshold value, the sensor 219 outputs a signal to the alarm 220 to generate an alarm signal to warn an operator (not shown) of the leak within the system 210, similar to the first embodiment. Once again, fewer pressure sensors 219 than the number illustrated may be provided as described in relation to the first embodiment. One or more alternative, or additional, ultrasonic sensor 219' may be provided in association with the secondary 223a-b and/or tertiary flow ducts 224a-d to detect small quantities of air present in the flow ducts.

From the foregoing exemplary embodiments therefore, it is evident that the reduced pressure of the liquid coolant within the heat exchanger associated with the electronic system of the present invention, minimises the transfer of the coolant onto the electronic components of the system in the event of a leak condition.

Whilst the embodiments depict a plurality of computer component 111, 211, a single computer component can be cooled by a heat exchanger 112, 212 as herein described. However, a multitude of such components can also readily be cooled by such a heat exchanger 112, 212. The capacity of the fluid reservoir 113, 213 and of the pumps 121, 221 can be increased and placed remotely from the system 110, 210 if necessary. A correspondingly higher capacity Venturi tube 122, 222 can be used to reduce the pressure of the cooling fluid to sub-atmospheric levels.

The invention claimed is:

1. An electronic system, comprising:
an electronic device;
a heat exchanger for exchanging heat with the device, the heat exchanger comprising a flow duct for receiving a fluid, at least a portion of the flow duct being arranged for thermal communication with the device; and
a pressure reducing unit comprising a pump associated with the flow duct and a Venturi tube configured for reducing the pressure of the fluid in the portion of the flow duct arranged in thermal communication with the device to a value in a range of about 0.6 to about 0.8 bar abs and less than the pressure external to the duct.

2. A system according to claim 1, wherein the pump is arranged within the flow duct.

3. A system according to claim 1 or claim 2, wherein the fluid comprises a liquid.

4. A system according to claim 1 or 2, wherein the portion of the flow duct arranged for thermal communication with the device has an internal cross-sectional area that is less than the internal cross-sectional area of a length of said flow duct excluding said portion.

5. A system according to claim 1 or 2, wherein the portion of the flow duct is in thermal contact with parts of the electronic device requiring exchange of heat.

6. A system according to claim 1 or 2, further comprising a leak detector detecting a breach in the flow duct.

7. A system according to claim 6, wherein the leak detector comprises a sensor sensing the pressure of the fluid within the flow duct.

8. A system according to claim 6, wherein the leak detector comprises an ultrasonic sensor sensing the presence of air within the flow duct.

9. A system according to claim 6, further comprising an alarm providing an alarm in response to signals output from the sensor.

10. A system according to claim 9, wherein the alarm is arranged to generate an alarm when the sensor senses a pressure value that is outside a predetermined range of pressure values.

11. A system according to claim 1 or 2, wherein the electronic device comprises a component for a computer or a computer server.

12. A system according to claim 11, wherein the electronic device comprises a suite of computer servers, each server being mounted on a separate framework.

13. A system according to claim 12, each framework having a flow duct associated therewith arranged in fluid communication with the pressure reducing unit.

14. A computer heat exchanger, comprising:
   a flow duct for receiving a fluid, at least a portion of the flow duct being arranged in thermal communication with the device; and
   a pressure reducing unit comprising a pump associated with the flow duct and a Venturi tube configured for reducing the pressure of the fluid in the portion of the flow duct arranged in thermal communication with the device to a value in a range of about 0.6 to about 0.8 bar abs and less than the pressure external to the duct.

* * * * *